US006271801B2

(12) United States Patent
Tuttle et al.

(10) Patent No.: US 6,271,801 B2
(45) Date of Patent: *Aug. 7, 2001

(54) EMBEDDED CIRCUITS

(75) Inventors: Mark E. Tuttle, Boise; Rickie C. Lake, Eagle, both of ID (US)

(73) Assignee: Micron Technology, Inc., Boise, ID (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/305,107

(22) Filed: May 4, 1999

Related U.S. Application Data

(62) Division of application No. 08/847,123, filed on May 1, 1997.

(51) Int. Cl.[7] .................................................. G04C 3/00
(52) U.S. Cl. ............................ 343/872; 340/572; 368/82
(58) Field of Search .................................. 343/872, 873, 343/700 MS, 866, 867

(56) References Cited

U.S. PATENT DOCUMENTS

| 3,701,317 | 10/1972 | Miyamoto et al. | 101/170 |
|---|---|---|---|
| 3,981,761 | 9/1976 | Kojima et al. | 156/235 |
| 4,075,632 | 2/1978 | Baldwin et al. | 343/68 R |
| 4,135,184 | * 1/1979 | Pruzick | 340/572 |
| 4,232,512 | * 11/1980 | Yoshikawa et al. | 368/82 |
| 4,926,182 | 5/1990 | Ohta et al. | 342/44 |
| 5,148,355 | 9/1992 | Lowe et al. | 361/410 |
| 5,402,095 | 3/1995 | Janniere | 235/441 |
| 5,412,192 | 5/1995 | Hoss | 235/380 |
| 5,428,214 | 6/1995 | Hakkers et al. | 235/492 |
| 5,528,222 | 6/1996 | Moskowitz et al. | 340/572 |
| 5,598,032 | 1/1997 | Fidalgo | 257/679 |
| 5,600,175 | 2/1997 | Orthmann | 257/532 |
| 5,621,412 | 4/1997 | Sharpe et al. | 342/51 |
| 5,647,122 | 7/1997 | Launay et al. | 29/840 |
| 5,649,296 | 7/1997 | MacLellan et al. | 455/38.2 |
| 5,729,053 | 3/1998 | Orthmann | 257/724 |
| 5,735,040 | 4/1998 | Ochi et al. | 29/841 |
| 5,850,690 | 12/1998 | Launay et al. | 29/841 |
| 5,880,934 | 3/1999 | Haghiri-Tehrani | 361/737 |
| 5,880,937 | 3/1999 | Schadhauser et al. | 361/794 |

FOREIGN PATENT DOCUMENTS

| 3201065 | 7/1993 | (DE) . |
|---|---|---|
| 4431605 | 3/1996 | (DE) . |
| 0 682 321 | 5/1995 | (EP) . |
| 8-138022 | 5/1996 | (JP) . |
| WO 90 07858 | 7/1990 | (WO) . |
| WO 96/07985 | 3/1996 | (WO) . |

* cited by examiner

*Primary Examiner*—Don Wong
*Assistant Examiner*—James Clinger
(74) *Attorney, Agent, or Firm*—Wells, St. John, Roberts, Gregory & Matkin, P.S.

(57) ABSTRACT

The invention includes methods for forming integrated circuits within substrates, and embedded circuits. In one aspect, the invention includes a method of forming an integrated circuit within a substrate comprising: a) providing a recess in a substrate; b) printing an antenna within the recess; and c) providing an integrated circuit chip and a battery in electrical connection with the antenna. In another aspect, the invention includes a method of forming an integrated circuit within a substrate comprising: a) providing a substrate having a first recess and a second recess formed therein; b) printing a conductive film between the first and second recesses and within the first and second recesses, the conductive film forming electrical interconnects between and within the first and second recesses; c) providing a first electrical component within the first recess and in electrical connection with the electrical interconnects therein; d) providing a second electrical component within the second recess and in electrical connection with the electrical interconnects therein; and e) covering the first electrical component, the second electrical component and the conductive film with at least one protective cover. In another aspect, the invention includes an embedded circuit comprising: a) a substrate having a recess therein, the recess having a bottom surface and a sidewall surface joined to the bottom surface; b) interconnect circuitry formed on the bottom and sidewall surfaces; and c) an integrated circuit chip within the recess and operatively connected to the interconnect circuitry.

11 Claims, 7 Drawing Sheets

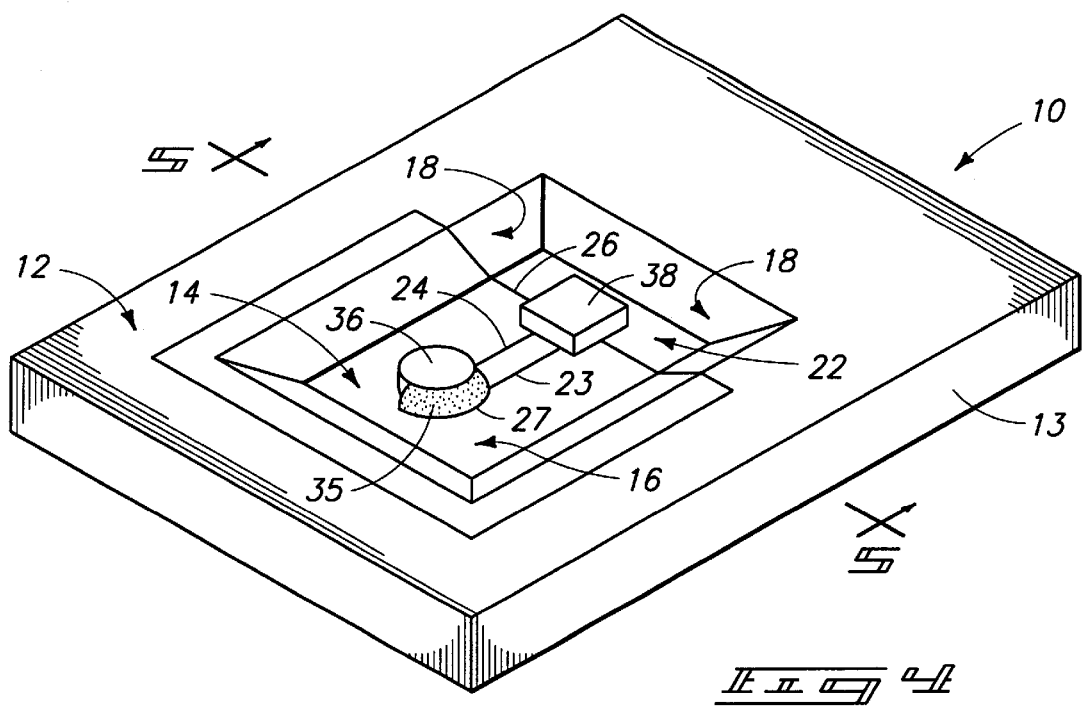
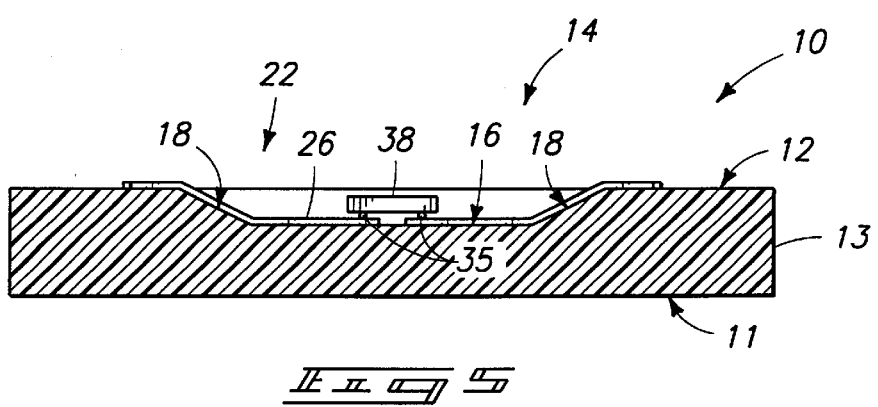

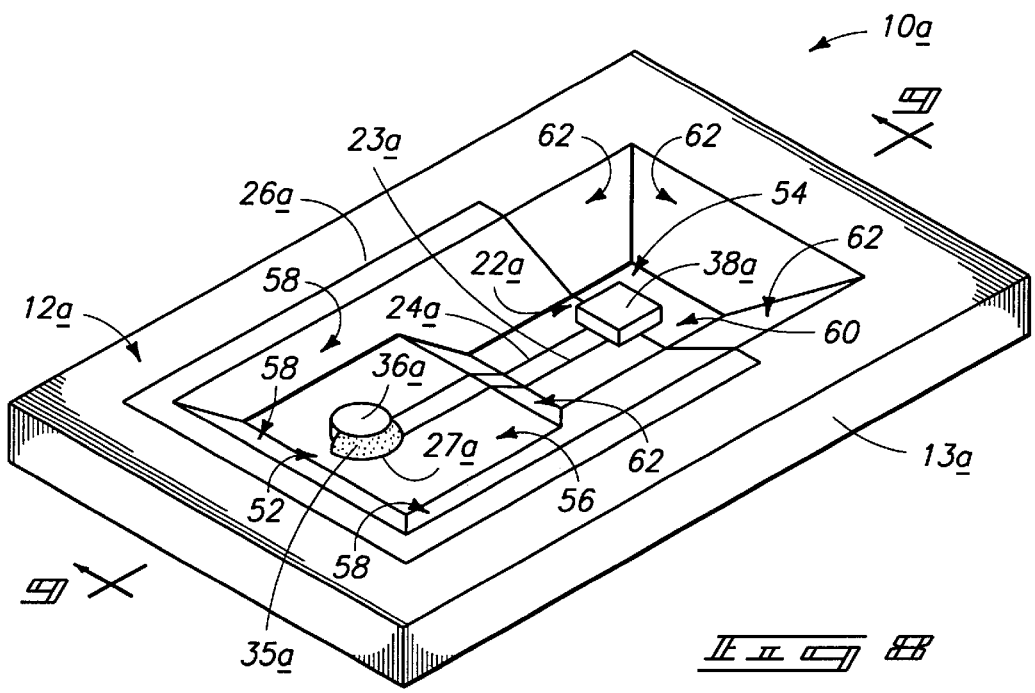
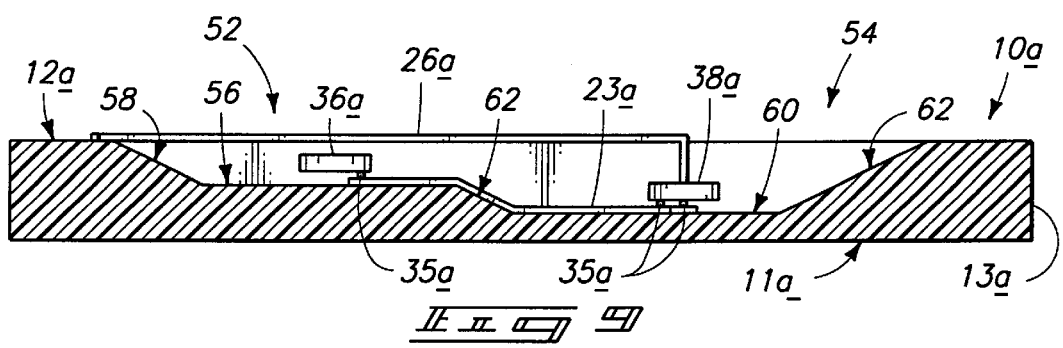

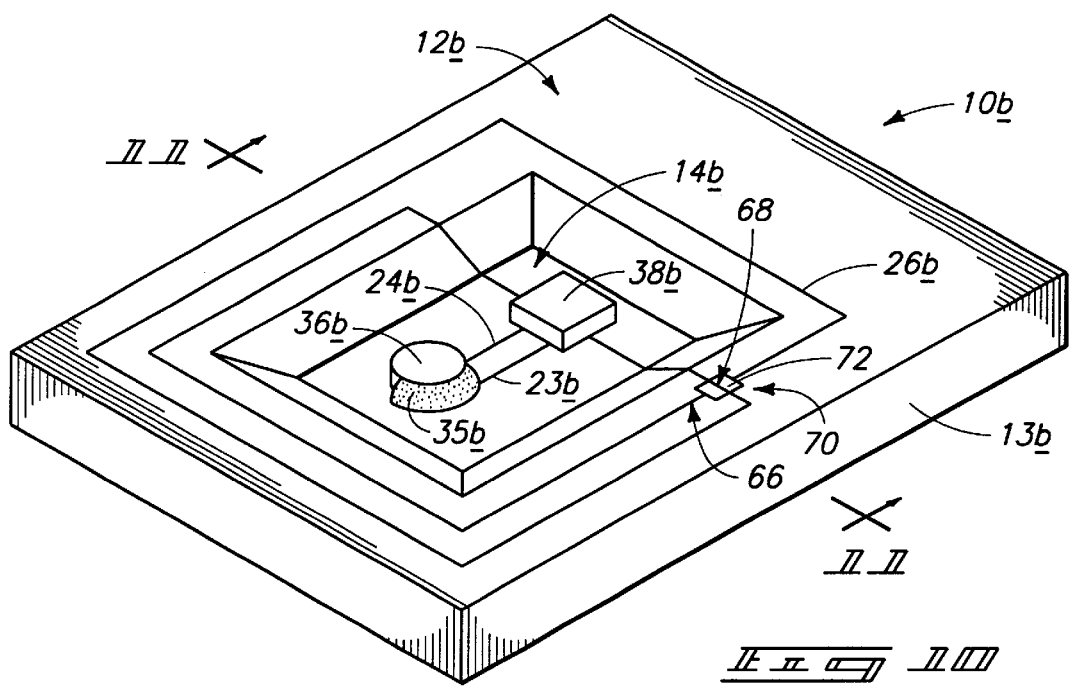
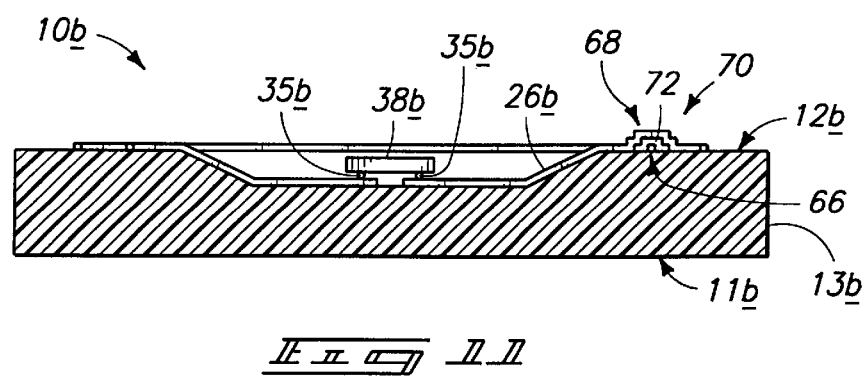

EMBEDDED CIRCUITS

RELATED PATENT DATA

This patent resulted from a divisional application of U.S. patent application Ser. No. 08/847,123, which was filed on May 1, 1997.

TECHNICAL FIELD

The invention pertains to methods of forming integrated circuits within substrates, and to embedded circuits. The invention is thought to have particular application towards methods of forming integrated circuits within personal cards, such as personal identification cards and credit cards.

BACKGROUND OF THE INVENTION

Smart cards typically include an integrated circuit providing both memory and processing functions, have words or pictures printed on them, and control who uses information stored in the integrated circuit and how the information is used.

Some smart cards have length and width dimensions corresponding to those of credit cards. The size of such smart cards is determined by an international standard (ISO 7816). ISO 7816 also defines the physical characteristics of the plastic, including temperature tolerance and flexibility. ISO 7816 also defines the position of electrical contacts and their functions, and the protocol for communications between the integrated circuit and readers (vending machines, pay phones, etc.). The term "smart card", as used herein, is meant to include cards that include microprocessors. Such cards might not conform to ISO 7816.

Several types of plastic are used for the casings or housings of smart cards. PVC and ABS are typical. PVC can be embossed, but is not recyclable. ABS is not readily embossed, but is recyclable.

Smart cards have many different applications. For example, smart cards can be pre-paid cards used instead of money for making purchases from vending machines, gaming machines, gas stations, car washes, photocopiers, laundry machines, cinemas, fast-food restaurants, retail outlets, or anywhere where cash is used. For example, they are commonly used in Europe with public telephones. A timer is used to deduct a balance from the card automatically while a conversation continues. Smart cards can be used as food stamps, or for redeeming other government-provided benefits. Because the transaction is electronic, the telephone, vending machine, etc. does not need to store cash, so risk of loss due to theft can be reduced. Change does not need to be stored and disbursed, and received payment can be directly wired to a bank. Pre-paid cards can be a form of advertising, because they can have logos or other information printed on them. The user would typically carry the card for weeks before using up the value on the card.

To authenticate a conventional credit card, a telephone call must be made to verify that sufficient funds are available. Smart cards permit such verification to be performed off-line, thus saving telecommunication charges. Smart cards thus provide an advantage over conventional credit cards. Smart cards can also be used as keys to gain access to restricted areas, such as secure areas of buildings, or to access parking lots.

Radio frequency identification devices (RFIDs) can also be considered smart cards if they include an integrated circuit. RFIDs are described in detail in U.S. patent application Ser. No. 08/705,043, filed Aug. 29, 1996, and incorporated herein by reference. RFIDs comprising integrated circuits may be referred to as intelligent RFIDs or as remote intelligent communication (RIC) devices.

Smart cards will typically contain an integrated circuit, typically provided as a packaged integrated circuit chip (IC chip). The smart card may also comprise electrical interconnects for connecting the IC chip to terminals. In other instances, the electronic interconnects will comprise an antenna, such as, for example, when the integrated circuit comprises radio frequency identification device circuitry. In other instances, an antenna, battery and IC may be inserted into smart cards. As smart cards are intended to be conveniently carried by persons, it is desirable to produce smart cards which are relatively thin, preferably having a size and shape similar to credit cards. This enables the cards to be carried on a person, such as, for example, in a person's wallet.

SUMMARY OF THE INVENTION

The invention encompasses methods for forming integrated circuits within substrates, and embedded circuits.

In one aspect, the invention encompasses a method of forming an integrated circuit within a substrate. A recess is formed in the substrate, and an antenna is printed within the recess. An integrated chip and a battery are provided in operative electrical connection with the antenna.

In another aspect, the invention encompasses a method of forming a plurality of cards. A substrate sheet is provided and a plurality of recesses are formed within the substrate sheet. The individual recesses have bottom surfaces and sidewall surfaces joined to the bottom surfaces. A conductive film is printed within the recesses to form electrical interconnects within the recesses. The electrical interconnects extend along the bottom surfaces and the sidewall surfaces of the recesses, and also on top surfaces of the substrate sheet. Integrated circuit chips are placed within the recesses and in electrical connection with the electrical interconnects. The integrated circuit chips and the conductive film within the recesses are covered with a protective cover. The substrate sheet is divided into a plurality of cards.

In another aspect, the invention encompasses an embedded circuit. The embedded circuit includes a substrate having a recess therein; a conductive circuit printed within the recess and an integrated circuit chip bonded to the conductive circuit.

In another aspect, the invention encompasses an embedded circuit. The embedded circuit includes a substrate having a recess therein; a conductive circuit printed within the recess; an integrated circuit chip bonded to the conductive circuit; and a battery in electrical connection with the integrated circuit chip.

BRIEF DESCRIPTION OF THE DRAWINGS

Preferred embodiments of the invention are described below with reference to the following accompanying drawings.

FIG. 4 is a perspective view of the FIG. 1 card shown at a processing step subsequent to that of FIG. 3.

FIG. 5 is a cross-sectional view of the FIG. 4 card taken along line 5—5 in FIG. 4.

FIG. 8 is a perspective view of a card being produced according to a second embodiment method of the present invention.

FIG. 9 is a cross-sectional view of the FIG. 8 card taken along the line 9—9 in FIG. 8.

FIG. 10 is a perspective view of a card being produced according to a third embodiment method of the present invention.

FIG. 11 is a cross-sectional view of the FIG. 10 card taken along the line 11—11 in FIG. 10.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
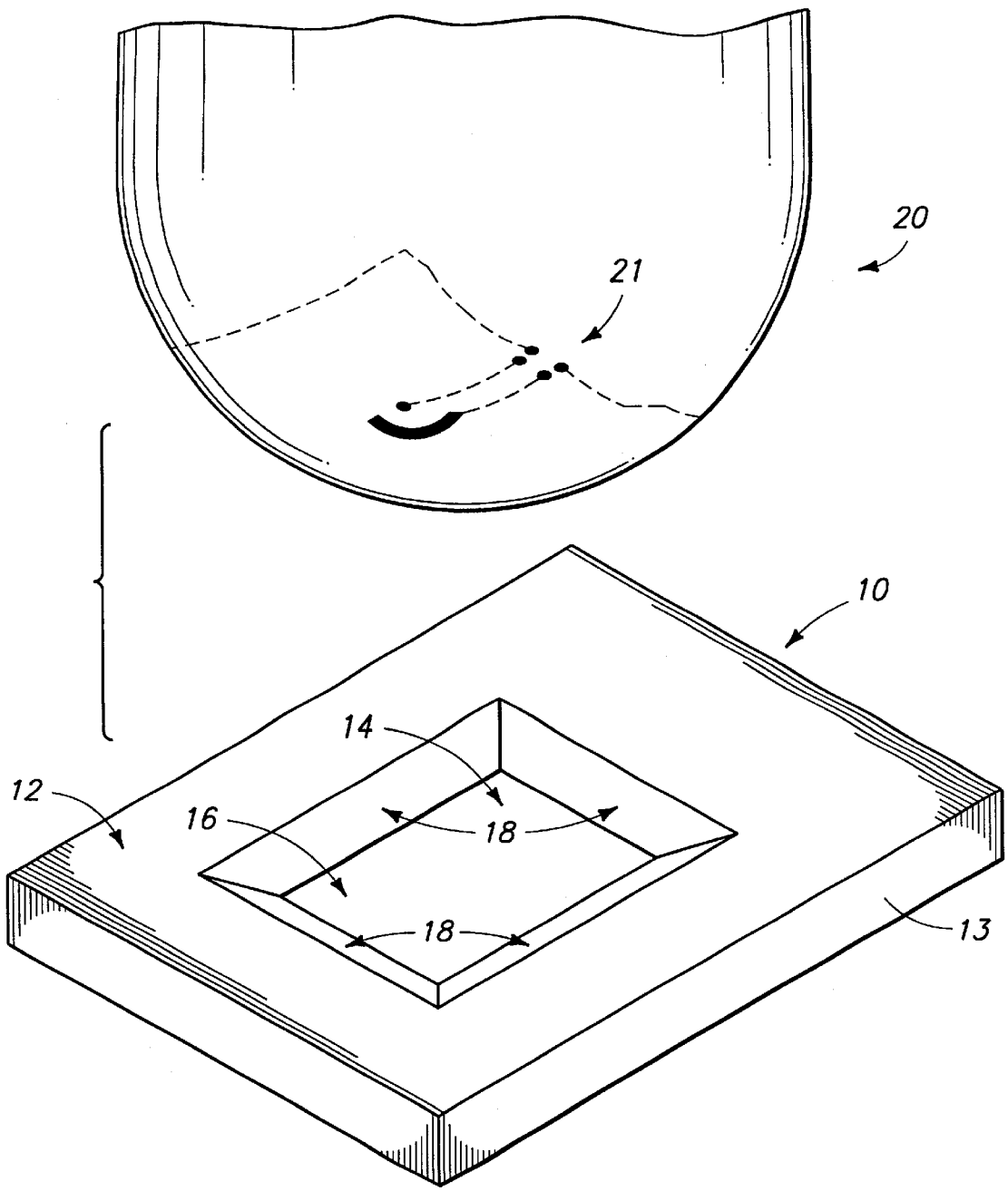
FIG. 1 is a schematic perspective view of a card and a printing pad at a preliminary step of a first embodiment method of the present invention.

A first embodiment method of the present invention is described with reference to FIGS. 1–7. Referring to FIG. 1, a substrate 10 is shown at a preliminary step of the first embodiment method. Substrate 10 is preferably a card substrate in the approximate shape of a credit card. Substrate 10 can comprise any of a number of materials known to persons of ordinary skill in the art, such as for example, PVC or ABS plastic. As will become apparent from the following discussion, substrate 10 might ultimately be used for a radio frequency card, smart card, or other card built with multiple, interconnected components, including an integrated circuit. Accordingly, substrate 10 preferably comprises a configuration suitable for one or more of the above-discussed ultimate uses.

Substrate 10 comprises a substrate body 13, a front surface 12, and an opposing back surface 11 (shown in FIG. 5). A recess 14 is provided through front surface 12 and into substrate 10. Recess 14 can be formed by conventional methods. Examples include cutting with a blade, grinding wheel or laser. Another example method for forming recess 14 is to form the recess in situ at a time of card creation by injection molding the card in a shape comprising recess 14. Recess 14 has a bottom surface 16 and sidewall surfaces 18 joined to bottom surface 16. As most clearly shown in FIGS. 5–7, sidewall surfaces 18 preferably extend non-perpendicularly from bottom surface 16. Such non-perpendicular orientation of sidewall surfaces 18 relative to bottom surface 16 can simplify a below-discussed printing of a circuit 22 (shown in FIG. 3) over such sidewall surfaces. It is noted, however, that the present invention also encompasses applications in which sidewall surfaces 18 extend perpendicularly from bottom surface 16.

Still referring to FIG. 1, a printing pad 20 is elevated above substrate 10. Printing pad 20 preferably comprises a deformable material, such as for example, foam, sponge, or silicone rubber. A circuit pattern 21 is formed on printing pad 20, and comprises, for example, a conductive film. Circuit pattern 21 can be formed by, for example, pressing pad 20 onto a plate having a shape corresponding to circuit pattern 21 etched within it.

Figure 2:
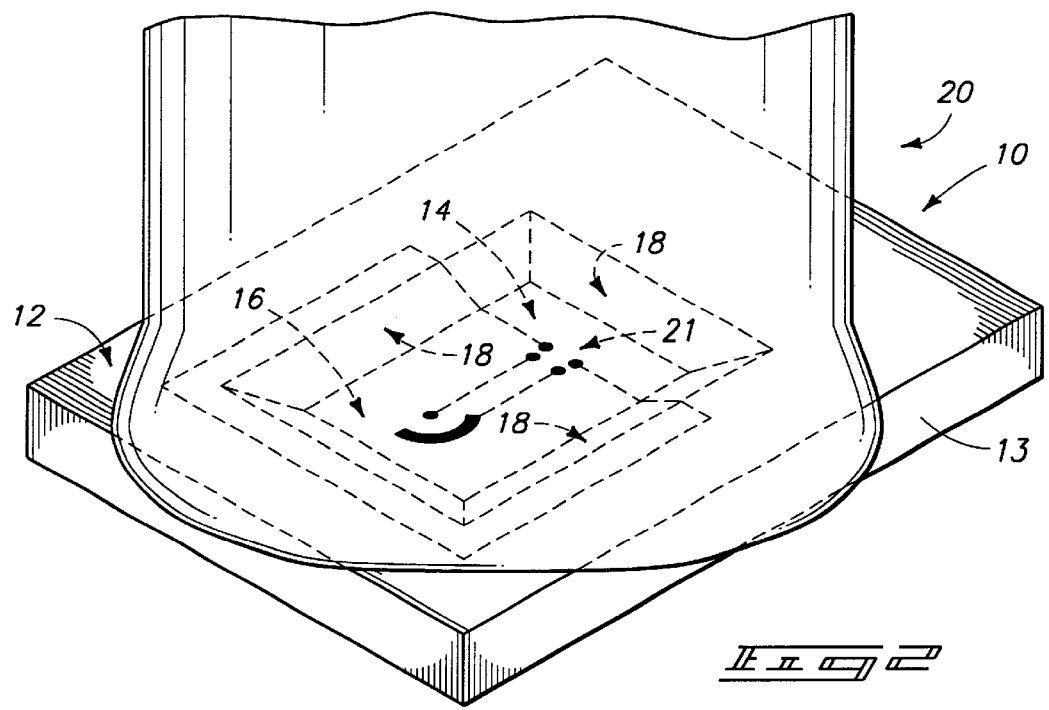
FIG. 2 is a schematic perspective view of the FIG. 1 card and printing pad shown at a processing step subsequent to that of FIG. 1.

Referring to FIG. 2, printing pad 20 is pressed against substrate 10 to transfer circuit pattern 21 to substrate 10 and thereby print a circuit 22 (shown in FIG. 3) upon substrate 10 and within recess 14. In the shown embodiment, printing pad 20 is configured to print the circuit pattern on bottom surface 16, on two of sidewall surfaces 18, and on upper surface 12. In alternate embodiments which are not shown, printing pad 20 can be configured to print on less than all of surfaces 16, 18 and 20. For instance, in such alternate embodiments, printing pad 20 may be configured to print only on bottom surface 16, or only on bottom surface 16 and one of the sidewall surfaces 18. Suitable materials which may be pad printed to form circuit 22 are conductive films, such as, for example, printed thick films (PTFs) comprising silver-filled organic material. It is noted that, although pad printing is shown, the printing can comprise other printing methods known to persons of ordinary skill in the art, including, for example, stencil printing, screen printing, spray printing, needle dispense printing, etc. After conductive circuit 22 is printed, the circuit can be cured by conventional methods.

After curing, circuit 22 will have a thickness and associated degree of conductivity. If the conductivity is lower than desired as may occur if, for example, conductive material of circuit 22 is too thin, or not adequately a low resistance material, the conductivity can be enhanced by providing an electroless plated metal, such as copper or nickel, against substrate 10 and circuit 22. The electroless plated metal plates conductive circuit 22, while not plating non-conductive surfaces of substrate 10. The electroless plating of metal can be accomplished by conventional methods.

Figure 3:
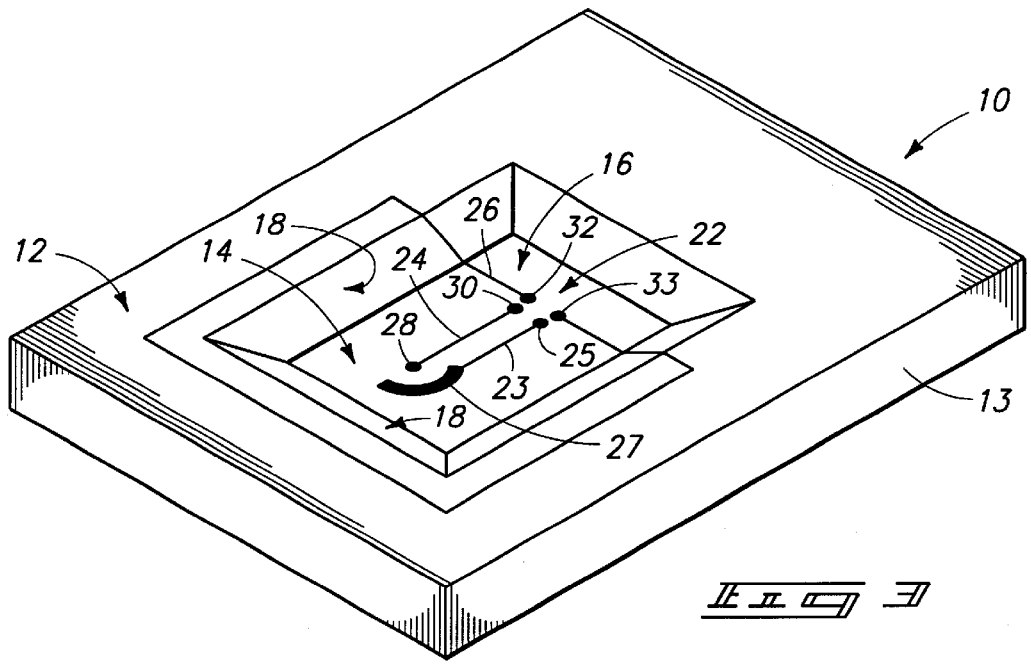
FIG. 3 is a perspective view of the FIG. 1 card shown at a processing step subsequent to that of FIG. 2.

Referring to FIG. 3, circuit 22 preferably comprises conductive interconnects 23 and 24, and an antenna 26. Interconnect 23 comprises nodes 25 and 27, interconnect 24 comprises nodes 28 and 30, and antenna 26 comprises nodes 32 and 33. Nodes 25, 27, 28, 30, 32 and 33 are illustrated as being wider than the rest of interconnects 23 and 24, and antenna 26. However, as will be appreciated by persons of ordinary skill in the art, nodes 25, 27, 28, 30, 32 and 33 could also be a same size as the rest of interconnects 23, 24 and antenna 26; or narrower than the rest of interconnects 23, 24 and antenna 26. Node 27 preferably comprises the shown arcuate shape complementary to an outer surface of a battery 36 (shown in FIG. 4), which is to be joined to node 27. In the shown preferred embodiment, antenna 26 is a loop antenna comprising a predominate portion outside of recess 14 and on substrate surface 12. In other embodiments (not shown), antenna 26 could be entirely within recess 14, or comprise a predominate portion within recess 14.

In the preferred embodiment, antenna 26 constitutes a part of, and is formed at the same time as, the other integrated circuitry. It is noted that antenna 26 could be formed in two steps, with a portion of antenna 26 being formed before or after pad printing of circuit 22. For instance, the portion of antenna 26 extending along upper surface 12 could be formed prior to printing circuit 22. Then, a portion of antenna 26 could be printed as part of circuit 22 to create nodes 32 and 33, and to connect the previously formed portion of antenna 26 with nodes 32 and 33. In such circumstances, the portion of antenna 26 which is not formed as part of circuit 22 could be formed by methods other than those utilized to form circuit 22. For instance, if circuit 22 is pad printed, the portion of antenna 26 not formed as part of circuit 22 could be formed by a method other than pad printing. Such other methods will be recognized by persons of ordinary skill in the art.

Referring to FIG. 4, electrical components 36 and 38 are bonded to one or more of nodes 25, 27, 28, 30, 32 and 33 (shown in FIG. 3). By way of example only, electrical component 36 comprises a battery and component 38 comprises a monolithic integrated circuit formed on a chip. Components 36 and 38 may be bonded to nodes 25, 27, 28, 30, 32 and 33 (shown in FIG. 3), utilizing a conductive adhesive 35 which is cured after provision of components 36 and 38. An example conductive adhesive 35 is a conductive epoxy. Battery 36 could alternatively be provided directly bonded to integrated circuit chip 38. In such circumstances, the bonding of battery 36 to integrated circuit 38 can occur either before or after placing integrated circuit 38 and battery 36 within recess 14. Also, as will be recognized by persons of ordinary skill in the art, at least one of the electrical components 36 or 38 could be provided externally of recess 14.

In the illustrated embodiment, interconnects 23 and 24 connect battery 36 to integrated circuit 38, and antenna 26 connects with integrated circuit 38. Battery 36, interconnects 23 and 24, integrated circuit 38 and antenna 26 together form a radio frequency identification device (RFID).

Figure 6:
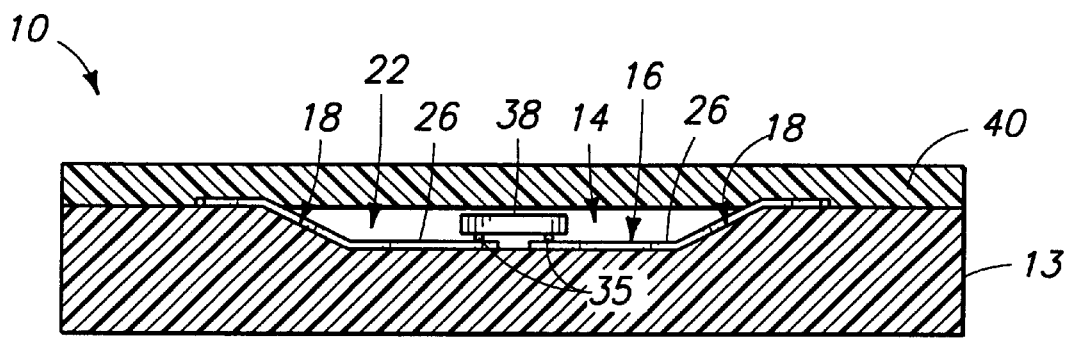
FIG. 6 is a cross-sectional view of the FIG. 1 card taken along line 5—5 in FIG. 4, and shown at a processing step subsequent to that of FIG. 5.
Figure 7:
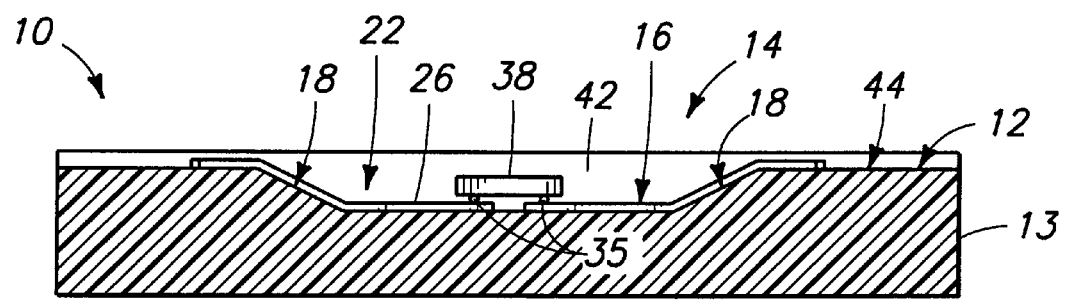
FIG. 7 is a cross-sectional view of the FIG. 1 card taken along line 5—5 in FIG. 4, and shown at a processing step subsequent to that of FIG. 5.

After provision of circuit 22 and one or both of components 36 and 38 within recess 14, a protective cover is ideally formed over circuit 22 and recess 14. FIGS. 6 and 7 illustrate two methods of protectively covering circuit 22 and the components within recess 14. Referring first to FIG. 6, a cap 40 can be adhered over substrate 10 and over recess 14. Cap 40 may be adhered, for example, by adhesives, such as glue, or by mechanical fasteners, such as staples or screws. Example materials for cap 40 include plastic, metal, and flexible or rigid adhesive tape. In the shown embodiment, portions of loop antenna 26 are between cap 40 and substrate body 13. Such portions of loop antenna 26 are generally thin enough that they do not interfere with bonding of cap 40 to substrate body 13. To further minimize interference of such portions of loop antenna 26 with bonding of cap 40 to substrate body 13, cap 40 can be formed of a material which conforms over and around loop antenna 26, such as, for example, a deformable material. Also, in embodiments which are not shown, antenna 26 can be formed entirely within recess 14 to minimize interference of antenna 26 with bonding of cap 40 to substrate body 13.

Referring to FIG. 7, circuitry 22 and components 36 and 38 can be covered with an encapsulant 42. Such encapsulant may comprise, for example, a low temperature curing insulating material, such as, for example, a two-part epoxy or urethane. Encapsulant 42 will preferably be provided initially as a liquid material and to overfill recess 14 and overlay antenna 26. Encapsulant 42 can then be cured into a solid mass, and either milled or sanded to form the shown preferred substantially planar upper surface 44.

It is noted that the methods of FIGS. 6 and 7 are merely example methods for covering circuitry proximate and within recess 14. The invention encompasses other methods for covering such circuitry which will be recognized by persons of ordinary skill in the art. The methods of FIGS. 6 and 7 could also be combined. For instance, a recess could be partially filled with an encapsulant and then covered. Such combined methods may have particular application toward sealing cards containing multiple recesses which are discussed below. In such cards, an integrated circuit could be within one recess and a battery within another. The integrated circuit could be covered with encapsulant and/or a cap, and the battery covered only with a removable cap. In such applications the integrated circuit would be well-protected and the battery could be easily replaceable.

After provision of a protective cover over recess 14, the construction of a card is substantially finished. The card may then be covered with a laminating film for cosmetic, printability, or logo reasons. An example laminating film would be a thin (less than about one mil) PVC sheet bonded to substrate 10 with an adhesive.

A second embodiment method of the present invention is described with reference to FIGS. 8 and 9. In describing FIGS. 8 and 9, numbering similar to that utilized above in describing FIGS. 1–7 will be used, with differences indicated by the suffix "a" or by different numerals.

Referring to FIGS. 8 and 9, a substrate 10a is illustrated. Substrate 10a comprises a first recess 52 and a second recess 54. In the illustrated and preferred embodiment, first recess 52 is formed in the substrate and second recess 54 is formed within first recess 52 and essentially constitutes a part thereof. A conductive circuit 22a is formed within recesses 52 and 54 and comprises interconnects 23a and 24a, and antenna 26a. Antenna 26a is a loop antenna which extends beyond recesses 52 and 54. Interconnects 23a and 24a connect electrical components 36a and 38a. Interconnects 23a and 24a, and antenna 26a, are preferably formed by printing a conductive film within first and second recesses 52 and 54, utilizing procedures analogous to those discussed above with reference to FIGS. 1–3.

In the illustrated embodiment, components 36a and 38a are each within a recess, with component 36a being within first recess 52 and component 38a being within second recess 54. First recess 52 comprises a bottom surface 56 and sidewall surfaces 58. Second recess 54 comprises a bottom surface 60 and sidewall surfaces 62. Sidewall surfaces 58 and 62 can extend non-perpendicularly from bottom surfaces 56 and 60, respectively, to simplify printing of circuit 22a over such sidewall surfaces. First recess 52 is separated from second recess 54 by one of the sidewall surfaces 62. The separating sidewall 62 extends non-perpendicularly from both of bottom surface 56 and bottom surface 60. Interconnects 23a and 24a extend over the separating sidewall surface 62 and along bottom surfaces 60 and 56. Interconnects 23a and 24a thus extend continuously from electrical component 36a to electrical component 38a.

Substrate 10a comprises a front surface 12a and an opposing back surface 11a. Preferably, first recess 52 and second recess 54 both extend through the same of either front surface 12a or back surface 11a. In FIGS. 8 and 9, recesses 52 and 54 are illustrated as both extending through front surface 12a.

Subsequent processing of substrate 10a can be performed in accordance with the processing of either FIG. 6 or FIG. 7 to cover first and second electrical components 36a and 38a, and electrical circuit 22a, with at least one protective cover.

A third embodiment method of the present invention is described with reference to FIGS. 10 and 11. In describing FIGS. 10 and 11, numbering similar to that utilized above in describing FIGS. 1–7 will be used, with differences indicated by the suffix "b" or by different numerals.

A substrate 10b comprises a substrate body 13b, a front surface 12b, and an opposing back surface 11b. A recess 14b is provided through front surface 12b and into substrate 10b. Electrical components 36b and 38b are within recess 14b and connected by interconnects 23b and 24b. A loop antenna 26b is electrically connected with component 38b. Loop antenna 26b extends from component 38b, out of recess 14b, and along surface 12b of substrate 10b. Antenna 26b crosses over itself at a bypass 70. Antenna 26b comprises a first portion 66 and a second portion 68 at bypass 70, with second portion 68 crossing over first portion 66. Bypass 70 comprises an insulative material 72 separating first portion 66 from second portion 68. Insulative material 72 can comprise, for example, silicon dioxide.

Methods for forming antenna 26b will be recognized by persons of ordinary skill in the art. Such methods could include, for example, printing methods similar to those discussed above in discussing FIGS. 1–3, with the exception that two printing steps would be utilized in forming antenna 26b. More specifically, a first printing step would be utilized to form the portion of antenna 26b underlying insulative material 72, and a second printing step would be utilized to form the portion of antenna 26b overlying material 72. Insulative material 72 would be formed between the two printing steps. Insulative material 72 can be formed by conventional methods.

Although the embodiment of FIGS. 10 and 11 is illustrated with only two loops and only one bypass 70, persons of ordinary skill in the art will recognize that alternate embodiments could be formed comprising more than two loops and a plurality of bypasses 70. The utilization of one or more bypasses 70 can advantageously permit relatively long loop antennas to be formed on a card substrate.

It is noted that although antenna second portion 68 is illustrated as being substantially perpendicular to antenna first portion 66 at bypass 70, the invention encompasses other embodiments (not shown) in which an antenna second portion is non-perpendicular to an antenna first portion at a bypass of the antenna portions.

The processing described above with reference to FIGS. 1–11 forms embedded circuits within substrates. Such embedded circuits can comprise, for example, circuitry 22, 22a or 22b, and one or more of components 36, 36a, 36b, 38, 38a and 38b.

Although FIGS. 1–11 illustrate formation of a single card, the invention encompasses methods in which a plurality of cards are formed. Such plurality of cards may be formed by forming a number of recesses within a single sheet, and then dividing the sheet into singulated cards. The division into singulated cards may occur before or after any of the steps illustrated in FIGS. 1–11. For example, the division into singulated cards may occur after printing of conductive circuitry (shown in FIG. 2), and prior to provision of components 36 and 38 within a recess. The division of a large sheet into singulated sheets can be performed by a number of methods known to persons of ordinary skill in the art, including, for example, sawing or cutting mechanically or by a laser.

Figure 12:
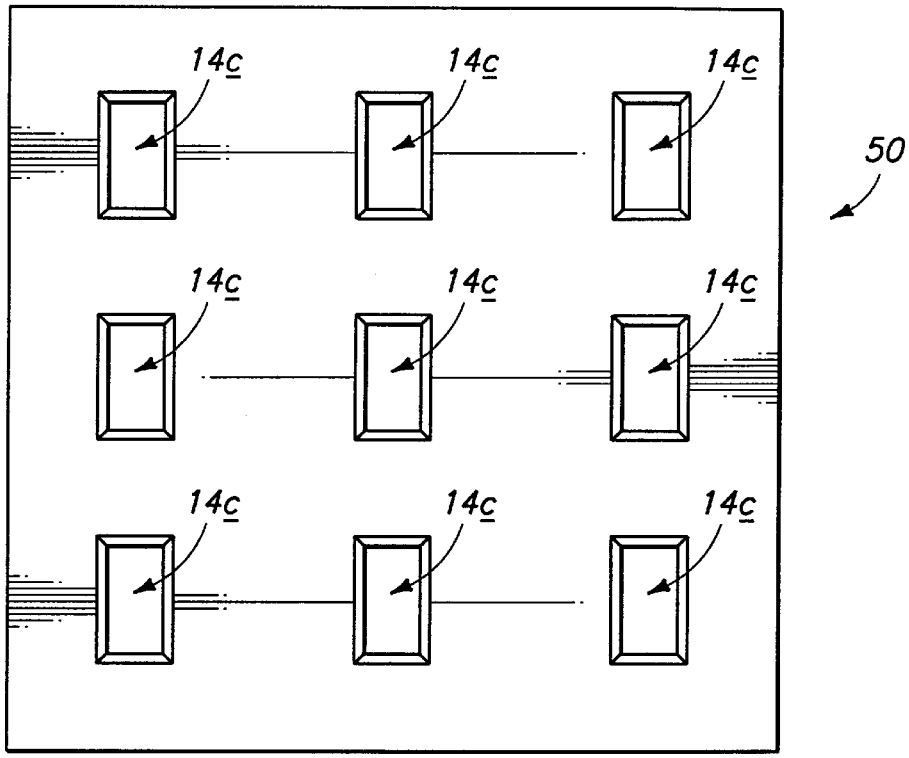
FIG. 12 is an elevational view of a substrate sheet processed according to a method of the present invention.
Figure 13:
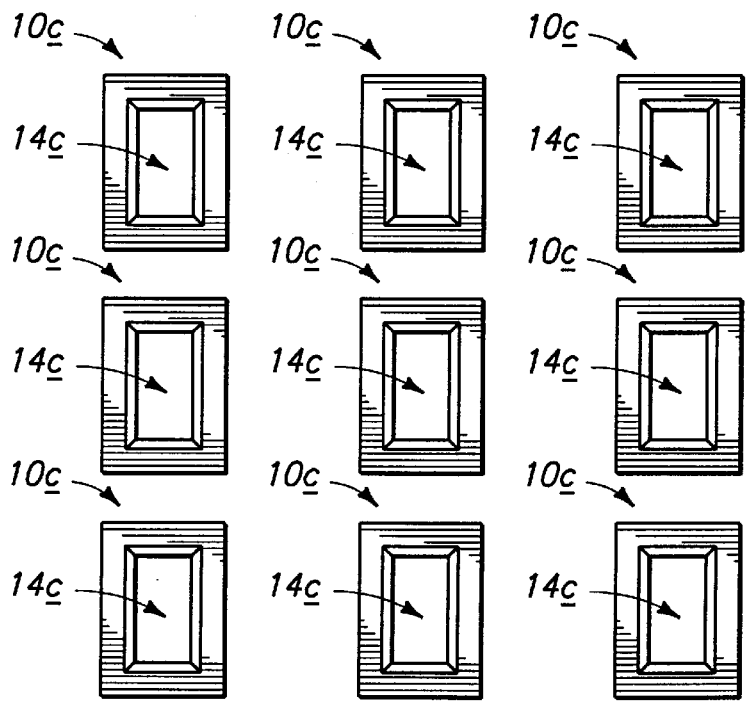
FIG. 13 is an elevational view of the sheet of FIG. 12 at a processing step shown subsequent to that of FIG. 12.

The formation of a number of individual cards from a single sheet substrate is illustrated in FIGS. 12 and 13. In referring to FIGS. 12 and 13, similar numbering to that utilized above in describing FIGS. 1–7 is utilized, with differences being indicated by the suffix "c" or with different numerals. Referring to FIG. 12, a sheet substrate 50 comprises a plurality of recesses 14c. Referring to FIG. 13, the sheet substrate 50 (shown in FIG. 12) is divided into a number of singular card substrates 10c. The individual card substrates 10c comprise at least one recess 14c. It is noted that the invention encompasses methods in which not all of the individual substrates 10c comprise equal numbers of recesses 14c, and encompasses embodiments in which some of the individual substrates comprise no recess 14c. However, generally at least two of the formed substrates 10c will comprise at least one recess 14c.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. An embedded circuit comprising:

a substrate having a recess therein;

a conductive circuit printed at least partially within the recess;

an integrated circuit chip bonded to the conductive circuit; and an antenna in electrical connection with the integrated circuit chip.

2. The embedded circuit of claim 1 wherein the antenna is a loop antenna in electrical connection with the integrated circuit chip, the loop antenna comprising a bypass where portions of the antenna cross one another, the bypass comprising a dielectric material between the crossing portions of the antenna.

3. The embedded circuit of claim 2 wherein the portions of the antenna which cross one another are substantially perpendicular to one another.

4. An embedded circuit comprising:

a substrate having a recess therein;

a conductive circuit printed at least partially within the recess;

an integrated circuit chip bonded to the conductive circuit;

a battery in electrical connection with the integrated circuit chip; and a loop antenna in electrical connection with the integrated circuit chip, the loop antenna comprising a bypass where portions of the antenna cross one another, the bypass comprising a dielectric material between the crossing portions of the antenna.

5. The embedded circuit of claim 4 wherein at least one of the battery and the integrated circuit chip is at least partially within the recess.

6. The embedded circuit of claim 4 wherein the substrate is a card configured for carrying on a person.

7. The embedded circuit of claim 4 further comprising a protective cover formed over the recess.

8. The embedded circuit of claim 4 wherein the portions of the antenna which cross one another are substantially perpendicular to one another.

9. An embedded circuit comprising:

a substrate having a recess therein, the recess having a bottom surface and a sidewall surface joined to the bottom surface;

interconnect circuitry formed on the bottom and sidewall surfaces;

an integrated circuit chip within the recess and operatively connected to the interconnect circuitry;

an antenna electrically connected to the integrated circuit chip; and a battery within the recess and electrically connected to the interconnect circuitry.

10. The embedded circuit of claim 9 wherein the substrate is a card configured for carrying on a person.

11. The embedded circuit of claim 9 further comprising a protective cover formed over the circuitry.

* * * * *

UNITED STATES PATENT AND TRADEMARK OFFICE
CERTIFICATE OF CORRECTION

PATENT NO.   : 6,271,801 B2
DATED        : August 7, 2001
INVENTOR(S)  : Mark E. Tuttle et al.

It is certified that error appears in the above-identified patent and that said Letters Patent is hereby corrected as shown below:

Column 2,
Line 26, replace "-integrated chip and a battery are-" with -- integrated circuit chip and a battery are --.

Column 4,
Line 33, replace "-plates conductive circuit 22-" with -- selectively plates conductive circuit 22 --.

Signed and Sealed this

Second Day of April, 2002

*Attest:*

JAMES E. ROGAN
*Attesting Officer*    *Director of the United States Patent and Trademark Office*